(12) United States Patent
Chan et al.

(10) Patent No.: US 7,202,172 B2
(45) Date of Patent: Apr. 10, 2007

(54) MICROELECTRONIC DEVICE HAVING DISPOSABLE SPACER

(75) Inventors: Bor-Wen Chan, Hsin-Chu (TW); Yu-I Wang, Hsin-Chu (TW); Han-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/728,995

(22) Filed: Dec. 5, 2003

(65) Prior Publication Data

US 2005/0121750 A1 Jun. 9, 2005

(51) Int. Cl.
*H01L 21/311* (2006.01)

(52) U.S. Cl. ............... 438/694; 438/595; 438/725; 438/780

(58) Field of Classification Search ........ 438/303, 438/301, 595, 694–696, 725, 780
See application file for complete search history.

(56) References Cited

U.S. PATENT DOCUMENTS

| | | | |
|---|---|---|---|
| 5,958,510 A * | 9/1999 | Sivaramakrishnam et al. ... | 427/255.6 |
| 6,218,224 B1 | 4/2001 | Lukanc et al. | |
| 6,251,802 B1 | 6/2001 | Moore et al. | |
| 6,294,480 B1 | 9/2001 | Pradeep et al. | |
| 6,362,109 B1 | 3/2002 | Kim et al. | |
| 6,440,866 B1 | 8/2002 | Collins et al. | |
| 6,440,875 B1 | 8/2002 | Chan et al. | |
| 6,444,531 B1 * | 9/2002 | Rupp et al. ............... | 438/303 |
| 6,503,848 B1 | 1/2003 | Chan et al. | |
| 6,506,639 B1 | 1/2003 | Yu et al. | |
| 6,524,916 B1 | 2/2003 | Scholer et al. | |
| 6,555,442 B1 | 4/2003 | Pai et al. | |
| 6,818,519 B2 * | 11/2004 | Fang et al. ............... | 438/301 |
| 2004/0157457 A1 * | 8/2004 | Xu et al. ................. | 438/694 |

\* cited by examiner

*Primary Examiner*—Sara Crane
(74) *Attorney, Agent, or Firm*—Haynes and Boone, LLP

(57) ABSTRACT

A method of manufacturing a microelectronic device comprising forming a patterned feature over a substrate and employing a fluorine-containing plasma source to deposit a conformal polymer layer over the patterned feature and the substrate. The polymer layer is etched to expose the patterned feature and a portion of the substrate, thereby forming polymer spacers on opposing sides of the patterned feature.

36 Claims, 2 Drawing Sheets

MICROELECTRONIC DEVICE HAVING DISPOSABLE SPACER

BACKGROUND

The present disclosure relates generally to microelectronic devices and, more specifically, a microelectronic device having a disposable spacer.

Microelectronic device geometries continue to dramatically decrease in size since their introduction several decades ago. Today's fabrication plants are routinely producing devices having feature dimensions less than 90 nm. This reduction in size has reduced manufacturing costs and increased device speed and capabilities.

As device geometries shrink, the materials and processes used in fabrication must adapt to achieve more challenging specifications. One commonly employed adaptation utilizes spacing and/or sacrificial material to define features of microelectronic devices. For example, spacing material may be incorporated during the fabrication of lightly doped drain/source (LLD) regions in a MOSFET to provide spatial control of doping profiles. Such spacers are typically removed at an intermediate manufacturing stage to prevent migration of impurities in the spacers that can degrade device operation. However, the removal of the spacers or other such sacrificial materials can also damage proximate device features.

Accordingly, what is needed in the art is a device and method of manufacture thereof that addresses the above discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
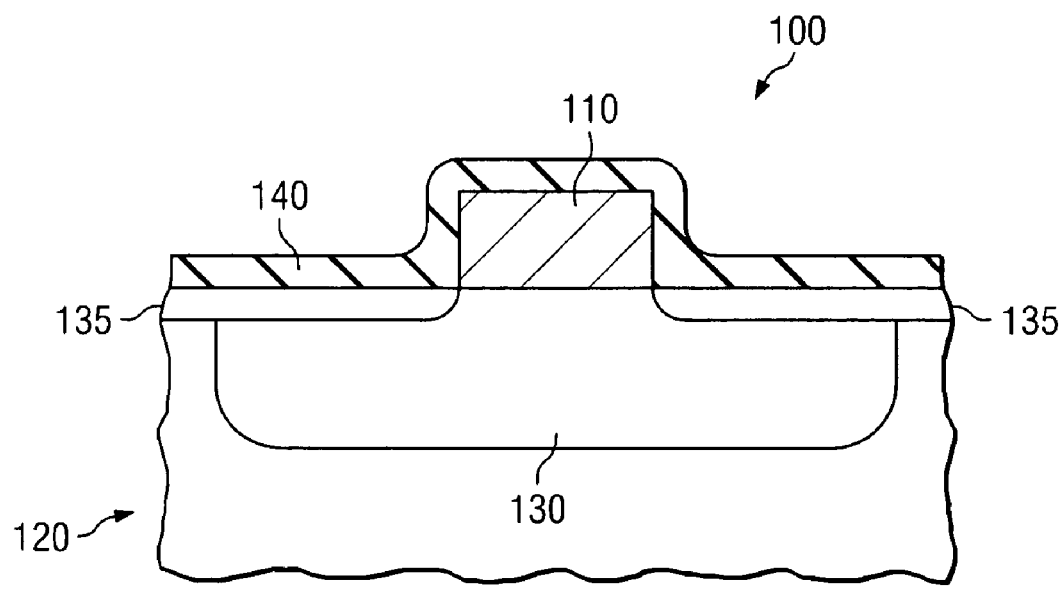
FIG. 1 illustrates a sectional view of one embodiment of a microelectronic device in an intermediate stage of manufacture according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of one embodiment of a microelectronic device 100 during an intermediate stage of manufacture according to aspects of the present disclosure. The microelectronic device 100 includes a patterned feature 110 formed over a substrate 120. In one embodiment, the patterned feature 110 is a gate stack or gate structure. For example, the microelectronic device 100 may be a transistor or other type of semiconductor device typically employing a gate structure, wherein the gate structure may be formed by depositing one or more layers over the substrate and subsequently patterning the deposited layers, possibly by wet or dry etching. An exemplary gate structure may include a gate oxide layer comprising one or more layers of $HfO_2$, $SiO_2$, nitrided oxide, silicon oxynitride and/or other materials and a gate electrode comprising one or more layers of doped or undoped polysilicon and/or metal silicides, such as cobalt silicide, tungsten silicide, titanium silicide, and/or metal salicide. One or more layers of such a gate structure, or other features contemplated by the patterned feature 110 within the scope of the present disclosure, may be formed by chemical-vapor deposition (CVD), physical-vapor deposition (PVD), plasma-enhanced CVD (PECVD), atomic layer deposition (ALD) and/or other process techniques. Conventional and/or future-developed etching and other processes may be employed to define the patterned feature 110 from the deposited layer(s).

Of course, the present disclosure is not limited to applications in which the patterned feature 110 is a gate structure or the microelectronic device 100 is a transistor or other semiconductor device. For example, in one embodiment, the microelectronic device 100 may be or comprise an electrically programmable read only memory (EPROM) cell, an electrically erasable programmable read only memory (EEPROM) cell, a static random access memory (SRAM) cell, a dynamic random access memory (DRAM) cell and/or other microelectronic devices (hereafter collectively referred to as microelectronic devices). In general, the patterned feature 110 contemplates microelectronic device applications in which it is desirable to protect the sides of a feature extending from a substrate by employing spacers each substantially spanning a side of the feature. For example, the patterned feature 110 may also or alternatively comprise a micro-machine structure, a conductive line, a capacitor and/or an inductor.

The substrate 120 may be a silicon-on-insulator (SOI) substrate, and may comprise silicon, gallium arsenide, strained silicon, silicon germanium, carbide, diamond and/or other materials. The substrate 120 may also include one or more uniformly or complementary doped wells 130. While not limited to any particular dopant types or schemes, in one embodiment, the doped wells 130 employ boron as a p-type dopant and deuterium-boron complexes for an n-type dopant. The deuterium-boron complexes may be formed by plasma treatment of boron-doped diamond layers with a deuterium plasma.

In one embodiment, the doped wells 130 may be formed using a high density plasma source with a carbon-to-deuterium ratio ranging between about 0.1 percent and about 5 percent in a vacuum process ambient. Boron doping may be provided by the mixing of a boron containing gas with a carbon/hydrogen gas. The boron containing gas may include $B_2H_6$, $B_2D_6$ and/or other boron containing gases. The concentration of boron doping may depend upon the amount of boron containing gas that may be leaked or added into the process. The process ambient pressure may range between 0.1 mTorr and about 500 Torr. The substrate 120 may be held at a temperature ranging between 150° C. and about 1100° C. High density plasma may be produced by a microwave electron cyclotron resonance (ECR) plasma, a helicon plasma, a inductively coupled plasma and/or other high density plasma sources. For example, the ECR plasma may utilize microwave powers ranging between about 800 Watts and about 2500 Watts.

As described above, the doped wells 130 may also comprise n-type deuterium-boron complex regions of the substrate 120, which may be formed by treating the above-described boron-doped regions employing a deuterium plasma. For example, selected areas of the substrate 120 may be covered by photoresist or another type of mask such that exposed boron-doped regions may be treated with the deuterium containing plasma. The deuterium ions may provide termination of dangling bonds, thereby transmuting the p-type boron-doped regions into n-type deuterium-boron complex regions. Alternatively, deuterium may be replaced with tritium, hydrogen and/or other hydrogen containing gases. The concentration of the n-type regions may generally be controlled by a direct current (DC) or a radio frequency (RF) bias of the substrate 120. The above-described processes may also be employed to form lightly-doped source/drain regions 135 in the substrate 120. Of course, other conventional and/or future-developed processes may also or alternatively be employed to form the source/drain regions 135.

The manufacture of the microelectronic device 100 also includes forming a conformal polymer layer 140 over the patterned feature 110 and one or more exposed portions of the substrate 120. The polymer layer 140 may be formed by chemical vapor deposition (CVD), plasma enhanced chemical vapor deposition (PECVD), atomic layer deposition (ALD), physical vapor deposition (PVD), evaporation, spin-on coating and/or other fabrication processes (hereafter collectively referred to as the polymer deposition). In one embodiment, plasma etch processes may be employed to form the polymer layer 140 over the sidewalls of the patterned feature 110 and over the substrate 120. In a plasma etch environment, polymer may be formed on the process reactor and the substrate 120.

The polymers may be created by the reaction of fluorine-containing gases such as $C_4F_6$, $C_3F_8$, $C_4F_8$, $CF_4$, $CF_3$, $C_2F_2$, $C_2F_6$, $SF_6$, $C_3F$, $CH_3F$ and/or other fluorocarbons. In addition, HBr and/or other carbon-containing gases may be employed in conjunction with fluorocarbon reactants such as CO, $CO_2$, and R—O, wherein R may be a carbon containing ligand. The reactant gases $CHF_3$, $CH_2F_2$, and/or $CH_3F$ may also or alternatively be injected into the process environment with or as the fluorine-containing gases. The flow rate of the reactant gas may range between about 5 sccm and about 200 sccm. Inert gases may be also incorporated into the process, including He, $N_2$, Ar and Xe. The chemistry employed to deposit the polymer layer 140 may also include chlorine-containing gases, such as $Cl_2$ and chlorocarbons, and/or bromine-containing gases, such as HBr.

The polymer layer 140 may be deposited in a single or batch substrate process reactor in a low pressure or atmospheric pressure processing environment. The polymer material forming the polymer layer 140 may be induced by plasma, wherein a plasma source may be generated by radio frequency (RF) or direct current (DC). The polymer layer 140 may also be formed employing an inductively coupled plasma (ICP) source, a helicon plasma source, a direct coupled plasma source, an electron cyclotron resonance (ECR) plasma source, a magnetically enhanced plasma source, a surface wave plasma source, a coronal discharge plasma source and/or other sources (herein collectively referred to as plasma sources).

Formation of the polymer layer 140 may also include applying a DC or RF bias to the substrate 120. In one embodiment, the polymer layer 140 may be deposited with a bias power ranging between about 1 Watt and about 50 Watts applied to the patterned feature 110 and/or the substrate 120. Low bias power applied to the patterned feature 110 and the substrate 120 may provide isotropic deposition of the polymer layer 140. Low bias power may also reduce plasma ion bombardment and the etch rate, while allowing polymer formation to be the prominent reaction within the reactive plasma environment. The polymer layer 140 may be have a thickness ranging between about 5 Angstroms and about 1000 Angstroms, although the thickness of the polymer layer 140 is not limited within the scope of the present disclosure.

The polymer layer 140 may comprise chlorocarbons, fluorocarbons, bromocarbons and/or other dielectric polymer materials. In some embodiments, the material employed as the polymer layer 140 may be selected to be readily removed by ozone ($O_3$), $O_2$ plasma, $NO_2$, $CO_2$, CO and/or other dry or chemical etch methods.

Figure 2:
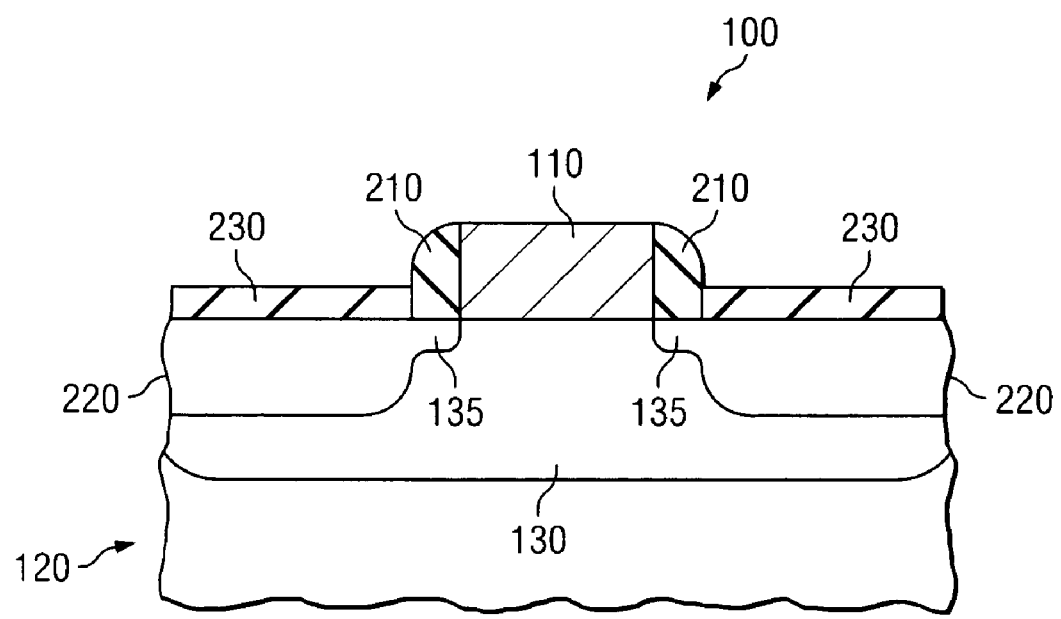
FIG. 2 illustrates a sectional view of the device shown in FIG. 1 in a subsequent stage of manufacture according to aspects of the present disclosure.

Referring to FIG. 2, illustrated is a sectional view of the microelectronic device 100 shown in FIG. 1 in a subsequent stage of manufacture according to aspects of the present disclosure. More specifically, FIG. 2 illustrates spacers 210 formed by etching, patterning or otherwise removing a portion of the polymer layer 140. In one embodiment, the spacers 210 are formed by a plasma etch back, possibly employing an $O_2$ or $O_3$ containing plasma, commonly known as "ashing." The removal process may additionally or alternatively employ other reactant species such as HCl, HBr, HI, $SF_6$, $Cl_2$, $NF_3$ and other compositions. Inert gases such as He, $N_2$, Ar and Xe may also be employed during the removal process.

In one embodiment, the formation and partial removal of the polymer layer 140 may be in-situ. For example, after the polymer layer 140 is formed to a sufficient thickness, the removal process may begin by increasing the input power for the plasma source and/or the RF or DC bias of the substrate 120 and/or patterned feature 110. In one embodiment, the power of the RF or DC bias on the substrate 120 may range between about 1 Watt and about 500 Watts. Of course, the spacers 210 may be formed from the polymer layer 140 by one or more additional and/or alternative processes within the scope of the present disclosure.

As also shown in FIG. 2, once the spacers 210 are formed, source/drain regions 220 may be formed, possibly having a dopant concentration that is substantially higher than the dopant concentration of the lightly doped source/drain regions 135, 220. The source/drain regions 135, 220 may be formed by ion implantation and/or other conventional or future-developed processes within the scope of the present disclosure.

After the source/drain regions 135, 220 are completed, contact regions 230 may be formed adjacent the spacers 210 or patterned feature 110, generally over the source/drain regions 135, 220. The contact regions 230 may comprise salicide, silicide and/or other materials, and may be formed by conventional and/or future-developed processes.

In one embodiment, the spacers 210 may be removed during an intermediate stage of manufacture. For example, the spacers 210 may be removed after the source/drain regions 220 are formed and before the contact regions 230 are formed, such that the contact regions 230 may abut the sides of the patterned feature 110. In another embodiment, the spacers 210 may be removed after the contact regions 230 are formed, such that the spacers 210 may be employed to ensure that the contact regions 230 do not contact the patterned feature 210. In general, the spacers 210 may be removed at any point in the fabrication of the microelectronic device 100.

The spacers 210 may be removed by the processes employed to form the spacers 210 form the polymer layer 140, as described above. For example, the spacers 210 may be removed by an etching process employing an ozone ($O_3$) or $O_2$ plasma and/or other dry or chemical etch methods.

Figure 3:
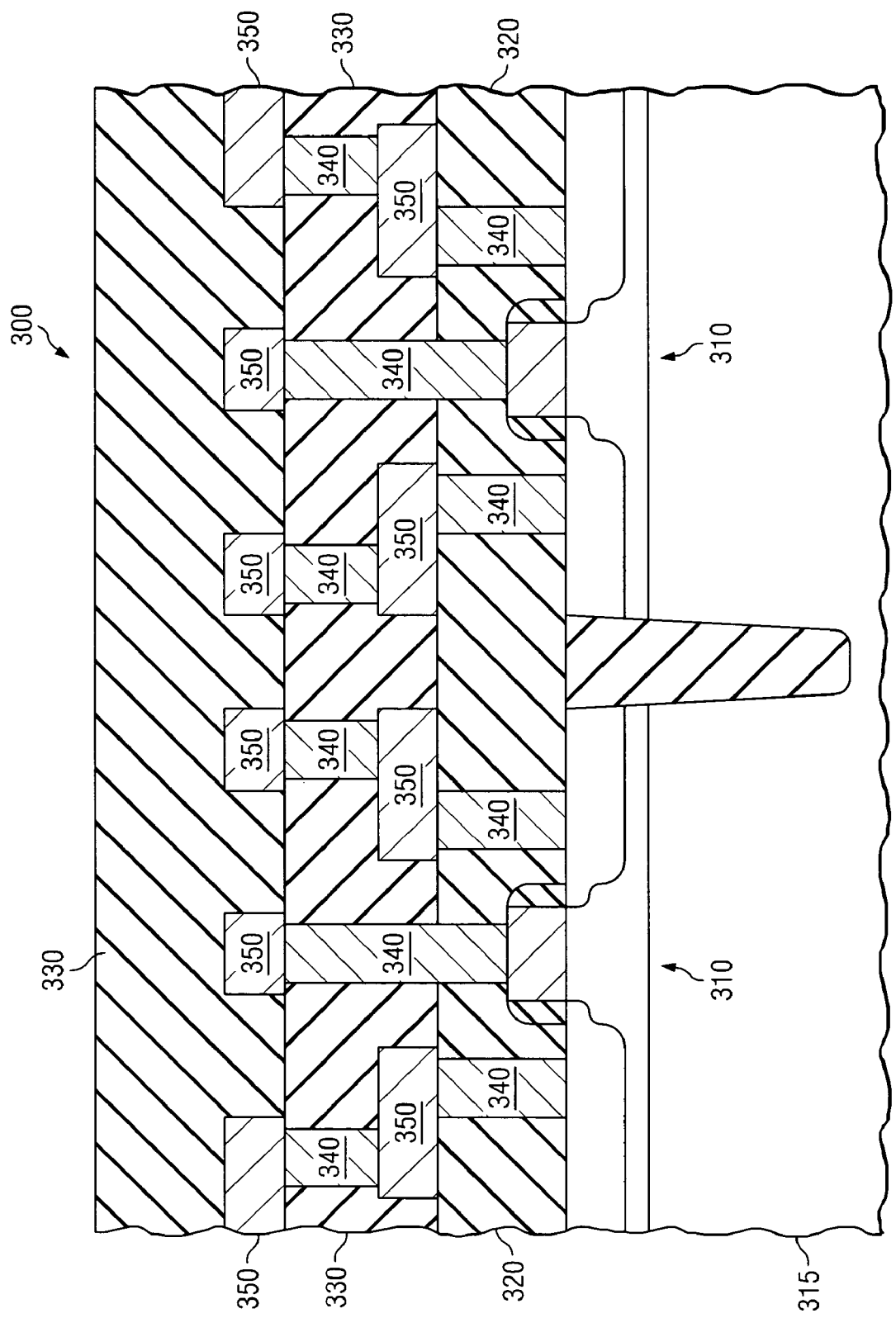
FIG. 3 illustrates a sectional view of one embodiment of an integrated circuit device constructed according to aspects of the present disclosure.

Referring to FIG. 3, illustrated is a sectional view of one embodiment of an integrated circuit device 300 constructed according to aspects of the present disclosure. The integrated circuit device 300 is one environment in which the microelectronic device 100 of FIGS. 1 and 2 may be incorporated. For example, the integrated circuit device 300 includes a plurality of semiconductor devices 310, wherein one or more of the semiconductor devices 310 may be substantially similar to the microelectronic device 100 of FIGS. 1 and 2. The semiconductor devices 310 may be formed from, in or on a common substrate 315 which may be substantially similar in composition and manufacture to the substrate 120 discussed above and shown in FIGS. 1 and 2. Of course, the integrated circuit device 300 may include other types of substrates, or multiple substrates, within the scope of the present disclosure.

The integrated circuit device 300 also includes one or more insulating layers 320, 330 located over the semiconductor devices 310. The first insulating layer 320, which may itself comprise multiple insulating layers, may be planarized to provide a substantially planar surface over the plurality of semiconductor devices 310.

The integrated circuit device 300 also includes vertical interconnects 340, such as conventional vias or contacts, and horizontal interconnects 350, such as conventional traces or runners, as viewed in FIG. 3 (all spatial references herein are for the purpose of example only and are not meant to limit the invention). The interconnects 340 may extend through one or more of the insulating layers 320, 330, and the interconnects 350 may extend along one of the insulating layers 320, 330 or a trench formed therein. In one embodiment, one or more of the interconnects 340, 350 may have a dual-damascene structure. The interconnects 340, 350 may be formed by etching or otherwise patterning the insulating layers 320, 330 and subsequently filling the pattern with refractive and/or conductive material, such as tantalum nitride, copper and aluminum.

Although embodiments of the present disclosure have been described in detail, those skilled in the art should understand that they may make various changes, substitutions and alterations herein without departing from the spirit and scope of the present disclosure.

What is claimed is:

1. A method of manufacturing a microelectronic device, comprising:
    forming a patterned feature on a substrate;
    depositing a conformal polymer layer on the patterned feature and the substrate, wherein such depositing employs a fluorine-containing plasma source;
    etching the polymer layer to expose the patterned feature and a portion of the substrate, thereby forming polymer spacers on opposing sides of the patterned feature; and
    forming an insulating layer on the polymer spacers.

2. The method of claim 1 wherein the conformal polymer layer is deposited in a chemical reactive plasma environment.

3. The method of claim 1 wherein the substrate comprises diamond.

4. The method of claim 1 wherein the substrate comprises strained silicon.

5. The method of claim 1 wherein the patterned feature is a semiconductor device gate structure.

6. The method of claim 1 wherein the fluorine-containing plasma source comprises $CF_4$.

7. The method of claim 1 wherein the fluorine-containing plasma source comprises $CF_3$.

8. The method of claim 1 wherein the fluorine-containing plasma source comprises $C_2F_2$.

9. The method of claim 1 wherein the fluorine-containing plasma source comprises $CH_2F_2$.

10. The method of claim 1 wherein the fluorine-containing plasma source comprises $CHF_3$.

11. The method of claim 1 wherein the fluorine-containing plasma source comprises $C_2F_6$.

12. The method of claim 1 wherein the fluorine-containing plasma source comprises $C_3F_8$.

13. The method of claim 1 wherein the fluorine-containing plasma source comprises $SF_6$.

14. The method of claim 1 wherein the fluorine-containing plasma source comprises $C_3F$.

15. The method of claim 1 wherein the fluorine-containing plasma source comprises $CH_3F$.

16. The method of claim 1 wherein the fluorine-containing plasma source comprises a fluorocarbon.

17. The method of claim 1 wherein a flow rate of the fluorine-containing plasma source ranges between about 5 sccm and about 200 sccm.

18. The method of claim 1 wherein the fluorine-containing plasma source further includes a chlorine-containing gas.

19. The method of claim 18 wherein the chlorine-containing gas comprises $Cl_2$ and chlorocarbons.

20. The method of claim 1 wherein the fluorine-containing plasma source further includes a bromine-containing gas.

21. The method of claim 20 wherein the bromine-containing gas comprises HBr.

22. The method of claim 1 wherein the etching employs an oxygen-containing gas.

23. The method of claim 22 wherein the oxygen-containing gas comprises $O_2$.

24. The method of claim 22 wherein the oxygen-containing gas comprises $O_3$.

25. The method of claim 22 wherein the oxygen-containing gas comprises $NO_2$.

26. The method of claim 22 wherein the oxygen-containing gas comprises $CO_2$.

27. The method of claim 22 wherein the oxygen-containing gas comprises CO.

28. The method of claim 1 wherein the step of depositing the polymer layer employs a direct current (DC) bias applied to the substrate ranging between about 1 Watts and about 50 Watts.

29. The method of claim 1 wherein the step of depositing the polymer layer employs a radio frequency (RF) bias applied to the substrate ranging between about 1 Watts and about 50 Watts.

30. The method of claim 1 wherein the etching the spacer employs a direct current (DC) bias applied to the substrate ranging between about 1 Watts and about 500 Watts.

31. The method of claim 1 wherein the etching the spacer employs a radio frequency (RF) bias applied to the substrate ranging between about 1 Watts and about 500 Watts.

32. The method of claim 1 further comprising:
forming source/drain regions in the substrate on opposing sides of the patterned feature.

33. The method of claim 32 wherein removing the spacers includes etching the spacers with an oxygen-containing gas.

34. A method of manufacturing a microelectronic device, comprising:
forming a doped well in a substrate;
forming a gate stack over the doped well;
forming, in-situ, polymer spacers on opposing sides of the gate stack by:
employing a substrate bias and a fluorine-containing plasma source to deposit a conformal polymer layer over the gate stack; and
adjusting the substrate bias, without removing the substrate bias, to etch the polymer layer with the fluorine-containing plasma, thereby exposing the gate stack and defining the polymer spacers; and
forming an insulating layer over the polymer spacers.

35. The method of claim 34 wherein forming the doped well includes:

employing a high density plasma source to form the doped well, the high density plasma source having a carbon-to-deuterium ratio ranging between about 0.1 percent and about 5 percent in a process ambient, wherein the process ambient pressure ranges between about 0.1 mTorr and about 500 Torr and the substrate is held at a temperature ranging between about 150° C. and about 1100° C.; and treating the doped well by employing a deuterium-containing plasma.

36. The method of claim 34 further comprising:

forming source/drain regions in the doped well via ion implantation before the step of forming the insulating layer, wherein forming the source/drain regions includes employing the polymer spacers to laterally limit formation of the source/drain regions during the ion implantation; and forming contact regions over the source/drain regions and contacting the polymer spacers, before the step of forming the insulating layer.

* * * * *